(12) United States Patent
Kuttner (10) Patent No.: US 10,396,815 B1
(45) Date of Patent: Aug. 27, 2019

(54) RFDAC (RF (RADIO FREQUENCY) DAC (DIGITAL-TO-ANALOG CONVERTER)) WITH IMPROVED EFFICIENCY AND OUTPUT POWER

(71) Applicant: Intel Corporation, Santa Clara, CA (US)

(72) Inventor: Franz Kuttner, St. Ulrich (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/233,501

(22) Filed: Dec. 27, 2018

(51) Int. Cl.
| | | |
|---|---|---|
| *H03M 1/78* | (2006.01) | |
| *H03M 1/80* | (2006.01) | |
| *H04B 1/04* | (2006.01) | |
| *H04B 1/40* | (2015.01) | |

(52) U.S. Cl.
CPC ........... *H03M 1/785* (2013.01); *H03M 1/808* (2013.01); *H04B 1/04* (2013.01); *H04B 1/40* (2013.01); *H04B 2001/0491* (2013.01)

(58) Field of Classification Search
CPC ........ H03M 1/785; H03M 1/808; H04B 1/04; H04B 1/40; H04B 2001/0491
USPC ................................. 341/141, 144–145, 154
See application file for complete search history.

(56) References Cited

U.S. PATENT DOCUMENTS

| | | | | |
|---|---|---|---|---|
| 8,462,035 B2 * | 6/2013 | Schimper | ............ | H03M 1/0881 341/145 |
| 9,525,383 B2 * | 12/2016 | Kuttner | ................. | H03F 1/0205 |

* cited by examiner

*Primary Examiner* — Khai M Nguyen
(74) *Attorney, Agent, or Firm* — Eschweiler & Potashnik, LLC (57) ABSTRACT

High efficiency amplitude DACs (Digital-to-Analog Converters) and RFDACs (Radio Frequency DACs) employing such amplitude DACs are discussed. One exemplary embodiment is a DAC comprising a plurality of DAC stages, wherein each DAC stage of the plurality of DAC stages is associated with a respective predetermined voltage of a plurality of predetermined voltages, wherein each DAC stage of the plurality of DAC stages can receive a digital signal at the respective predetermined voltage associated with that DAC stage when the respective predetermined voltage of that DAC stage is a selected predetermined voltage, wherein the selected predetermined voltage is based on an amplitude of the digital signal, and wherein each DAC stage of the plurality of DAC stages can generate a respective analog signal associated with that DAC stage based on the digital signal received at that DAC stage when the respective predetermined voltage of that DAC stage is the selected predetermined voltage.

23 Claims, 11 Drawing Sheets

RFDAC (RF (RADIO FREQUENCY) DAC (DIGITAL-TO-ANALOG CONVERTER)) WITH IMPROVED EFFICIENCY AND OUTPUT POWER

FIELD

The present disclosure relates to wireless technology, and more specifically to techniques and systems involving RFDAC(s) (Radio Frequency (RF) Digital-to-Analog Converter(s)) having improved efficiency and output power.

BACKGROUND

Mobile communication has evolved significantly from early voice systems to today's highly sophisticated integrated communication platform. The next generation wireless communication system, 5G (or new radio (NR)) will provide access to information and sharing of data anywhere, anytime by various users and applications. NR is expected to be a unified network/system that target to meet vastly different and sometime conflicting performance dimensions and services. Such diverse multi-dimensional requirements are driven by different services and applications. In general, NR will evolve based on 3GPP (Third Generation Partnership Project) LTE (Long Term Evolution)-Advanced with additional potential new Radio Access Technologies (RATs) to enrich people lives with better, simple and seamless wireless connectivity solutions. NR will enable everything connected by wireless and deliver fast, rich contents and services. For both NR and earlier standards, transmitter efficiency, including that of RFDAC(s) (RF (Radio Frequency) DAC(s) (Digital-to-Analog Converter(s)) employed in such transmitters, is a significant factor in terms of power consumption.

DETAILED DESCRIPTION

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising."

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some embodiments, the circuitry may be implemented in, or functions associated with the circuitry may be implemented by, one or more software or firmware modules. In some embodiments, circuitry may include logic, at least partially operable in hardware.

Various embodiments discussed herein comprise a tunable matching network comprising a wideband signal buffer, and systems and techniques that employ a tunable matching network as discussed herein. Tunable matching networks and associated systems and techniques discussed herein can provide small variability for gain attenuation, good linearity, and constant input and output impedance with different gain settings. As such, apparatuses, systems, and methods discussed herein can be employed for 5G (Fifth Generation) NR, including mmWave, in a transceiver of a communication device such as a UE (User Equipment) or base station such as a gNB (next generation Node B) or eNB (Evolved Node B).

Figure 1:
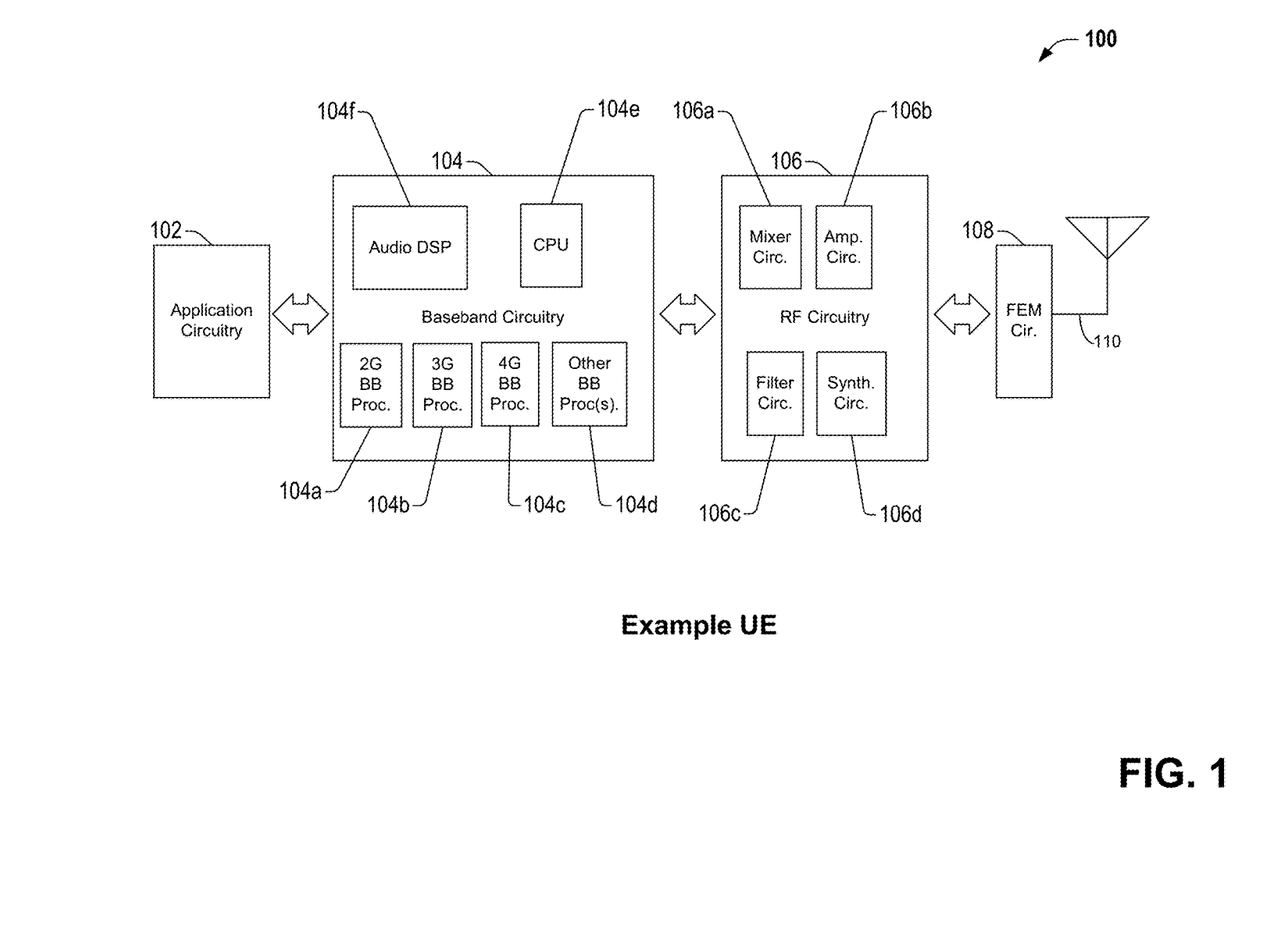
FIG. 1 is a block diagram illustrating an exemplary user equipment (UE) useable in connection with various aspects described herein.

Embodiments described herein may be implemented into a system using any suitably configured hardware and/or software. FIG. 1 illustrates, for one embodiment, example components of a User Equipment (UE) device 100. In some embodiments, the UE device 100 may include application circuitry 102, baseband circuitry 104, Radio Frequency (RF) circuitry 106, front-end module (FEM) circuitry 108 and one or more antennas 110, coupled together at least as shown.

The application circuitry 102 may include one or more application processors. For example, the application circuitry 102 may include circuitry such as, but not limited to, one or more single-core or multi-core processors. The processor(s) may include any combination of general-purpose processors and dedicated processors (e.g., graphics processors, application processors, etc.). The processors may be coupled with and/or may include memory/storage and may be configured to execute instructions stored in the memory/storage to enable various applications and/or operating systems to run on the system.

The baseband circuitry 104 may include circuitry such as, but not limited to, one or more single-core or multi-core processors. The baseband circuitry 104 may include one or more baseband processors and/or control logic to process baseband signals received from a receive signal path of the RF circuitry 106 and to generate baseband signals for a transmit signal path of the RF circuitry 106. Baseband processing circuity 104 may interface with the application circuitry 102 for generation and processing of the baseband signals and for controlling operations of the RF circuitry 106. For example, in some embodiments, the baseband circuitry 104 may include a second generation (2G) baseband processor 104a, third generation (3G) baseband processor 104b, fourth generation (4G) baseband processor 104c, and/or other baseband processor(s) 104d for other existing generations, generations in development or to be developed in the future (e.g., fifth generation (5G), 6G, etc.). The baseband circuitry 104 (e.g., one or more of baseband processors 104a-d) may handle various radio control functions that enable communication with one or more radio networks via the RF circuitry 106. The radio control functions may include, but are not limited to, signal modulation/demodulation, encoding/decoding, radio frequency shifting, etc. In some embodiments, modulation/demodulation circuitry of the baseband circuitry 104 may include Fast-Fourier Transform (FFT), precoding, and/or constellation mapping/demapping functionality. In some embodiments, encoding/decoding circuitry of the baseband circuitry 104 may include convolution, tail-biting convolution, turbo, Viterbi, and/or Low Density Parity Check (LDPC) encoder/decoder functionality. Embodiments of modulation/demodulation and encoder/decoder functionality are not limited to these examples and may include other suitable functionality in other embodiments.

In some embodiments, the baseband circuitry 104 may include elements of a protocol stack such as, for example, elements of an evolved universal terrestrial radio access network (EUTRAN) protocol including, for example, physical (PHY), media access control (MAC), radio link control (RLC), packet data convergence protocol (PDCP), and/or radio resource control (RRC) elements. A central processing unit (CPU) 104e of the baseband circuitry 104 may be configured to run elements of the protocol stack for signaling of the PHY, MAC, RLC, PDCP and/or RRC layers. In some embodiments, the baseband circuitry may include one or more audio digital signal processor(s) (DSP) 104f. The audio DSP(s) 104f may include elements for compression/decompression and echo cancellation and may include other suitable processing elements in other embodiments. Components of the baseband circuitry may be suitably combined in a single chip, a single chipset, or disposed on a same circuit board in some embodiments. In some embodiments, some or all of the constituent components of the baseband circuitry 104 and the application circuitry 102 may be implemented together such as, for example, on a system on a chip (SOC).

In some embodiments, the baseband circuitry 104 may provide for communication compatible with one or more radio technologies. For example, in some embodiments, the baseband circuitry 104 may support communication with an evolved universal terrestrial radio access network (EUTRAN) and/or other wireless metropolitan area networks (WMAN), a wireless local area network (WLAN), a wireless personal area network (WPAN). Embodiments in which the baseband circuitry 104 is configured to support radio communications of more than one wireless protocol may be referred to as multi-mode baseband circuitry.

RF circuitry 106 may enable communication with wireless networks using modulated electromagnetic radiation through a non-solid medium. In various embodiments, the RF circuitry 106 may include switches, filters, amplifiers, etc. to facilitate the communication with the wireless network. RF circuitry 106 may include a receive signal path which may include circuitry to down-convert RF signals received from the FEM circuitry 108 and provide baseband signals to the baseband circuitry 104. RF circuitry 106 may also include a transmit signal path which may include circuitry to up-convert baseband signals provided by the baseband circuitry 104 and provide RF output signals to the FEM circuitry 108 for transmission.

In some embodiments, the RF circuitry 106 may include a receive signal path and a transmit signal path. The receive signal path of the RF circuitry 106 may include mixer circuitry 106a, either as multiplication of signals or as a sampling of the signal, amplifier circuitry 106b and filter circuitry 106c. The transmit signal path of the RF circuitry 106 may include filter circuitry 106c and mixer circuitry

106a. RF circuitry 106 may also include synthesizer circuitry 106d for synthesizing a frequency for use by the mixer circuitry 106a of the receive signal path and the transmit signal path. In some embodiments, the mixer circuitry 106a of the receive signal path may be configured to down-convert RF signals received from the FEM circuitry 108 based on the synthesized frequency provided by synthesizer circuitry 106d. The amplifier circuitry 106b may be configured to amplify the down-converted signals and the filter circuitry 106c may be a low-pass filter (LPF) or band-pass filter (BPF) configured to remove unwanted signals from the down-converted signals to generate output baseband signals. Output baseband signals may be provided to the baseband circuitry 104 for further processing. In some embodiments, the output baseband signals may be zero-frequency baseband signals, although this is not a requirement. In some embodiments, mixer circuitry 106a of the receive signal path may comprise passive mixers, although the scope of the embodiments is not limited in this respect.

In some embodiments, the mixer circuitry 106a of the transmit signal path may be configured to up-convert input baseband signals based on the synthesized frequency provided by the synthesizer circuitry 106d to generate RF output signals for the FEM circuitry 108. The baseband signals may be provided by the baseband circuitry 104 and may be filtered by filter circuitry 106c. The filter circuitry 106c may include a low-pass filter (LPF), although the scope of the embodiments is not limited in this respect.

In some embodiments, the mixer circuitry 106a of the receive signal path and the mixer circuitry 106a of the transmit signal path may include two or more mixers and may be arranged for quadrature down conversion and/or up conversion respectively. In some embodiments, the mixer circuitry 106a of the receive signal path and the mixer circuitry 106a of the transmit signal path may include two or more mixers and may be arranged for image rejection (e.g., Hartley image rejection). In some embodiments, the mixer circuitry 106a of the receive signal path and the mixer circuitry 106a may be arranged for direct down conversion and/or direct up conversion, respectively. In some embodiments, the mixer circuitry 106a of the receive signal path and the mixer circuitry 106a of the transmit signal path may be configured for super-heterodyne operation.

In some embodiments, the output baseband signals and the input baseband signals may be analog baseband signals, although the scope of the embodiments is not limited in this respect. In some alternate embodiments, the output baseband signals and the input baseband signals may be digital baseband signals. In these alternate embodiments, the RF circuitry 106 may include analog-to-digital converter (ADC) and digital-to-analog converter (DAC) circuitry and the baseband circuitry 104 may include a digital baseband interface to communicate with the RF circuitry 106.

In some dual-mode embodiments, a separate radio IC circuitry may be provided for processing signals for each spectrum, although the scope of the embodiments is not limited in this respect.

In some embodiments, the synthesizer circuitry 106d may be a fractional-N synthesizer or a fractional N/N+1 synthesizer, although the scope of the embodiments is not limited in this respect as other types of frequency synthesizers may be suitable. For example, synthesizer circuitry 106d may be a delta-sigma synthesizer, a frequency multiplier, or a synthesizer comprising a phase-locked loop with a frequency divider.

The synthesizer circuitry 106d may be configured to synthesize an output frequency for use by the mixer circuitry 106a of the RF circuitry 106 based on a frequency input and a divider control input. In some embodiments, the synthesizer circuitry 106d may be a fractional N/N+1 synthesizer.

In some embodiments, frequency input may be provided by a voltage controlled oscillator (VCO), although that is not a requirement. Divider control input may be provided by either the baseband circuitry 104 or the applications processor 102 depending on the desired output frequency. In some embodiments, a divider control input (e.g., N) may be determined from a look-up table based on a channel indicated by the applications processor 102.

Synthesizer circuitry 106d of the RF circuitry 106 may include a divider, a delay-locked loop (DLL), a multiplexer and a phase accumulator. In some embodiments, the divider may be a dual modulus divider (DMD) and the phase accumulator may be a digital phase accumulator (DPA). In some embodiments, the DMD may be configured to divide the input signal by either N or N+1 (e.g., based on a carry out) to provide a fractional division ratio. In some example embodiments, the DLL may include a set of cascaded, tunable, delay elements, a phase detector, a charge pump and a D-type flip-flop. In these embodiments, the delay elements may be configured to break a VCO period up into Nd equal packets of phase, where Nd is the number of delay elements in the delay line. In this way, the DLL provides negative feedback to help ensure that the total delay through the delay line is one VCO cycle.

In some embodiments, synthesizer circuitry 106d may be configured to generate a carrier frequency as the output frequency, while in other embodiments, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some embodiments, the output frequency may be a LO frequency (fLO). In some embodiments, the RF circuitry 106 may include an IQ/polar converter.

FEM circuitry 108 may include a receive signal path which may include circuitry configured to operate on RF signals received from one or more antennas 110, amplify the received signals and provide the amplified versions of the received signals to the RF circuitry 106 for further processing. FEM circuitry 108 may also include a transmit signal path which may include circuitry configured to amplify signals for transmission provided by the RF circuitry 106 for transmission by one or more of the one or more antennas 110.

In some embodiments, the FEM circuitry 108 may include a TX/RX switch to switch between transmit mode and receive mode operation. The FEM circuitry may include a receive signal path and a transmit signal path. The receive signal path of the FEM circuitry may include a low-noise amplifier (LNA) to amplify received RF signals and provide the amplified received RF signals as an output (e.g., to the RF circuitry 106). The transmit signal path of the FEM circuitry 108 may include a power amplifier (PA) to amplify input RF signals (e.g., provided by RF circuitry 106), and one or more filters to generate RF signals for subsequent transmission (e.g., by one or more of the one or more antennas 110).

In some embodiments, the UE device 100 may include additional elements such as, for example, memory/storage, display, camera, sensor, and/or input/output (I/O) interface.

Figure 2:
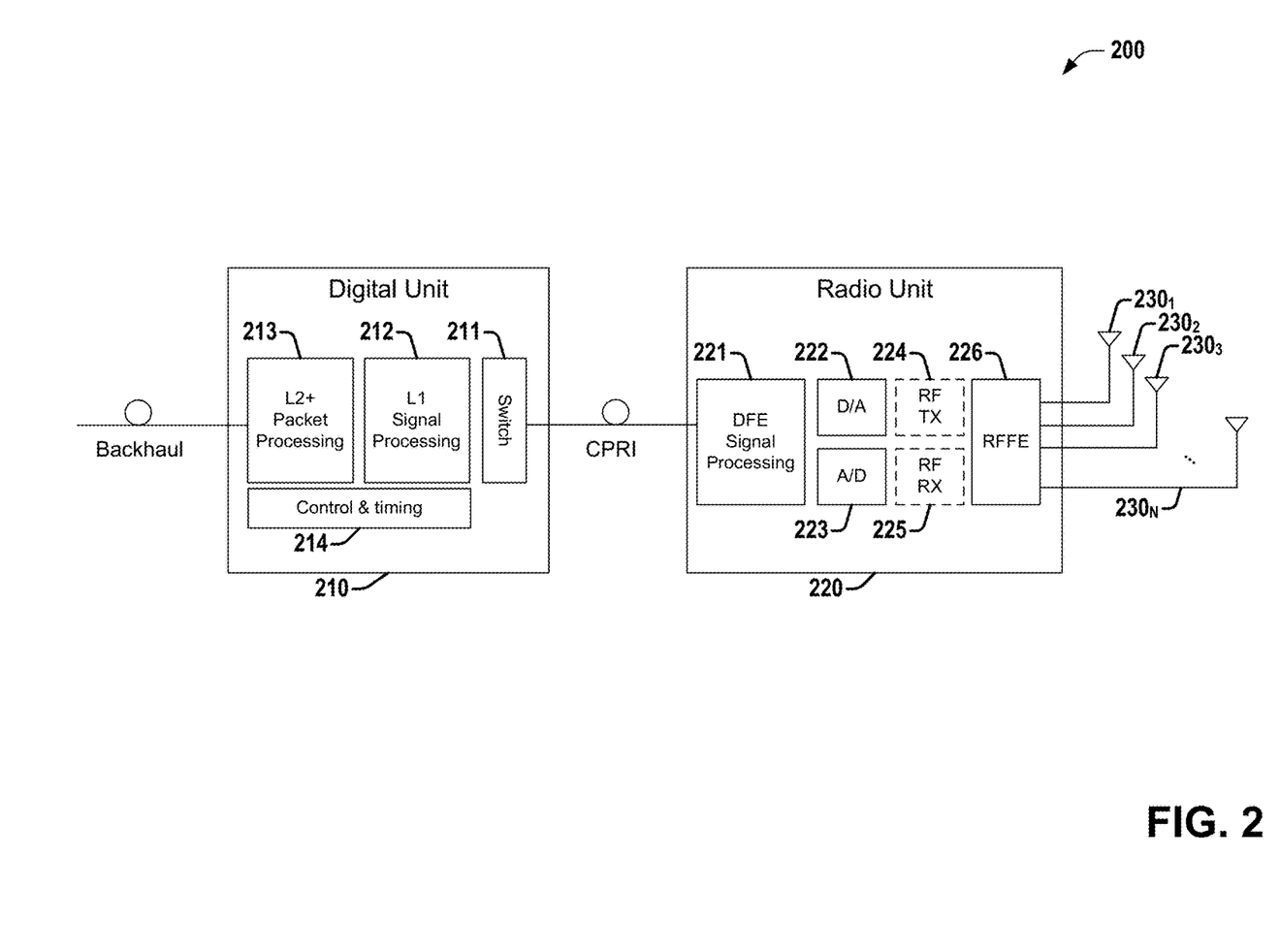
FIG. 2 is a block diagram illustrating example components of a Base Station (BS) device (e.g., eNB, gNB, etc.) that can be employed in connection with various aspects discussed herein.

Referring to FIG. 2, illustrated are example components of a Base Station (BS) device (e.g., eNB, gNB, etc.) 200 that can be employed in connection with various aspects discussed herein. In some embodiments, the BS device 200 can comprise a digital unit 210 and one or more radio units 220, each of which can be connected to one or more antennas 230$_i$.

The digital unit 210 can comprise a switch 211, layer 1 (L1) signal processing circuitry 212, layer 2+(L2+) packet processing circuitry 213, and control and timing circuitry 214. The digital unit 210 can perform at least the following functions: (a) Switching (e.g., via switch 211) between various radio units (on cell towers or roof tops), and various baseband cards, in the digital unit; (b) Layer 1 signal processing (e.g., via L1 signal processing circuitry 212), performing the modulation/demodulation and forward error correction functions of actual waveforms to be transmitted on different RF carriers and bands; (c) Layer 2 scheduling of users (e.g., via L2+ packet processing circuitry 213); (d) Layer 2/layer 3 packet processing (e.g., via L2+ packet processing circuitry 213); (e) Control plane processing and timing/synchronization (e.g., via control and timing circuitry 214); and (f) Encryption of packets going into the backhaul (e.g., via control and timing circuitry 214). In various embodiments, the backhaul link to the core network can be one or more of wired (e.g., copper, fiber, etc.) or wireless (for example, via a mesh network comprising one or more additional access points, etc.).

Each radio unit 220 can comprise DFE (Digital Front End) signal processing circuitry 221, one or more digital to analog converters (DACs) 222 associated with transmit chain(s), one or more analog to digital converters (ADCs) 223 associated with receive chain(s), optional RF (Radio Frequency) transmit circuitry 224 associated with transmit chain(s), optional RF (Radio Frequency) receive circuitry 225 associated with receive chain(s), and RF FE (Front End) circuitry 226. The digital unit 210 can perform at least the following functions: (a) Digital front-end (DFE) signal processing (perform digital IF carrier combining, crest factor reduction, digital pre-distortion of Power Amplifiers) (e.g., via DFE signal processing circuitry 221); (b) Digital to Analog and Analog to Digital conversion (e.g., via DACs 222 and ADCs 223); (c) RF mixing (i.e. modulation), and RF frequency synthesizers; (d) RF Front-end functions: power amplifiers (PA), low-noise amplifiers (LNA), Variable gain amplifiers (VGA), filters, switches (TDD) or duplexers (FDD) (e.g., via RF front end circuitry 226). In aspects omitting RF transmit circuitry 224 and/or RF receive circuitry 225, The DACs 222 and/or ADCs 223 can work at RF sampling rates, making analog/RF modulation/demodulation unnecessary.

From radio unit(s) 220, the RF signal can be fed to antennas 230$_i$. In current radio base-stations, antennas are external, and there is an industry effort to develop Active antenna systems (AAS) with integrated RF and antenna arrays, for example, for 5G.

Various embodiments discussed herein relate to RFDAC(s) (Radio Frequency DAC(s)) (e.g., employable as DAC(s) of RF circuitry 106 of system 100 or as DAC(s) of DACs 222 of system 200) having improved efficiency and output power compared to existing RFDACs. Additional embodiment include transceiver(s) and/or communication device(s) (e.g., UE(s) (User Equipment(s)), Base Station(s) (e.g., gNB(s), eNB(s), etc.) employing RFDAC(s) according to embodiments discussed herein (e.g., as DAC(s) of RF circuitry 106 of system 100 or as DAC(s) of DACs 222 of system 200). Embodiments discussed herein can employ a switched-mode technique for providing input signals to the amplitude DAC (e.g., DAC for the amplitude of a polar system), which can improve the efficiency of switched mode techniques of generating the analog RF output from the DAC output.

Figure 3:
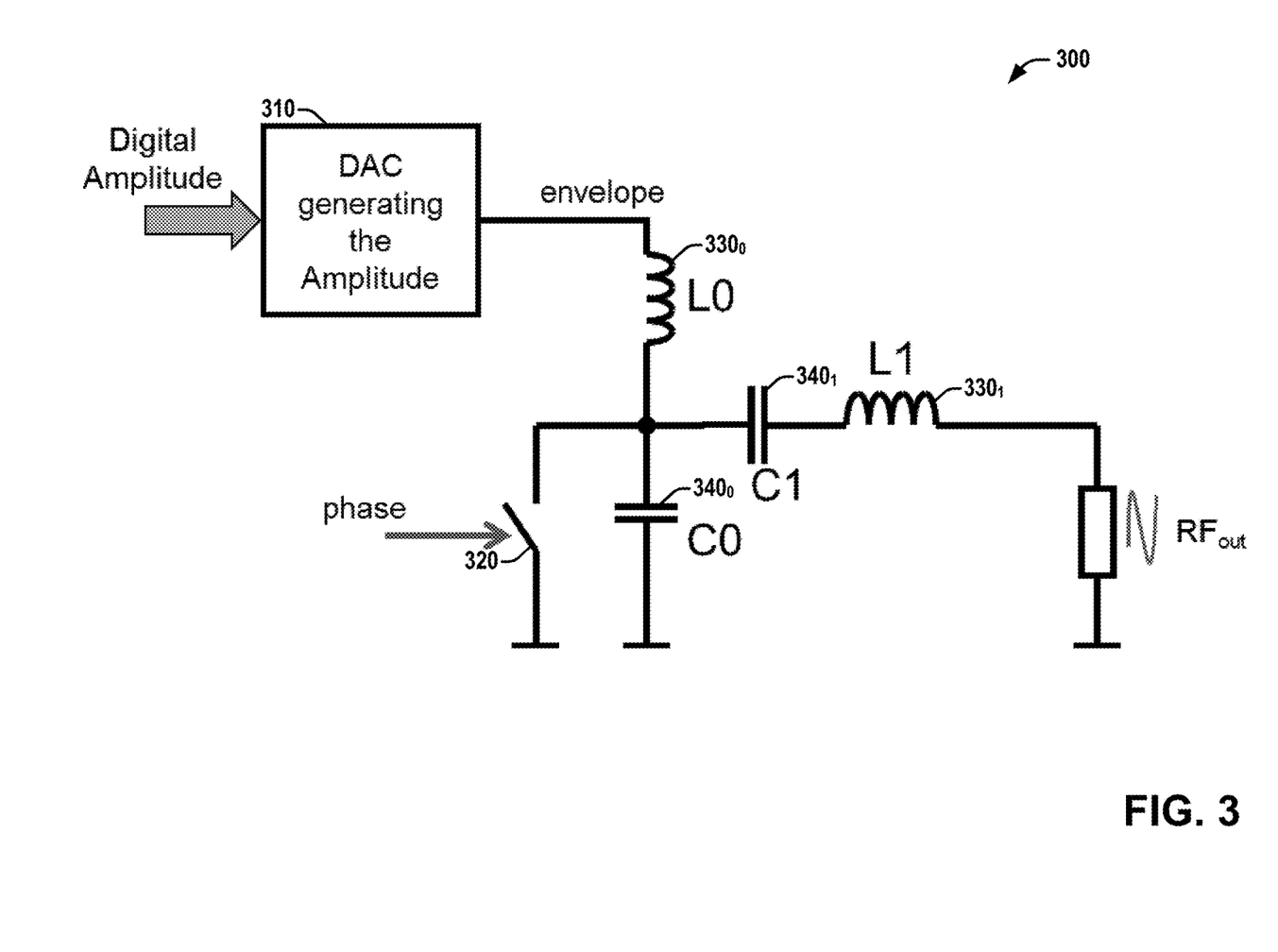
FIG. 3 is a diagram illustrating an example switched mode RFDAC built as a class E DAC, in connection with various aspects discussed herein.

The envelope elimination and restoration transmitter technique (EER) offers high efficiency. In theory, a switched mode RFDAC built as a class E DAC can deliver 100% efficiency over the total power range. Referring to FIG. 3, illustrated is a diagram of an example switched mode RFDAC 300 built as a class E DAC, in connection with various aspects discussed herein. RFDAC 300 comprises a DA converter 310 configured to generate a voltage that represents the amplitude, and a switch 320 configured to operate with a modulated frequency for the polar system 300 (along with inductors 330$_0$ and 330$_1$ and capacitors 340$_0$ and 340$_1$). In various embodiments, switch 320 can be implemented and/or connected in a variety of manners, such as connected to ground as illustrated in FIG. 3, to one or more capacitive units to regulate voltage and/or match impedance, etc.

Figure 4:
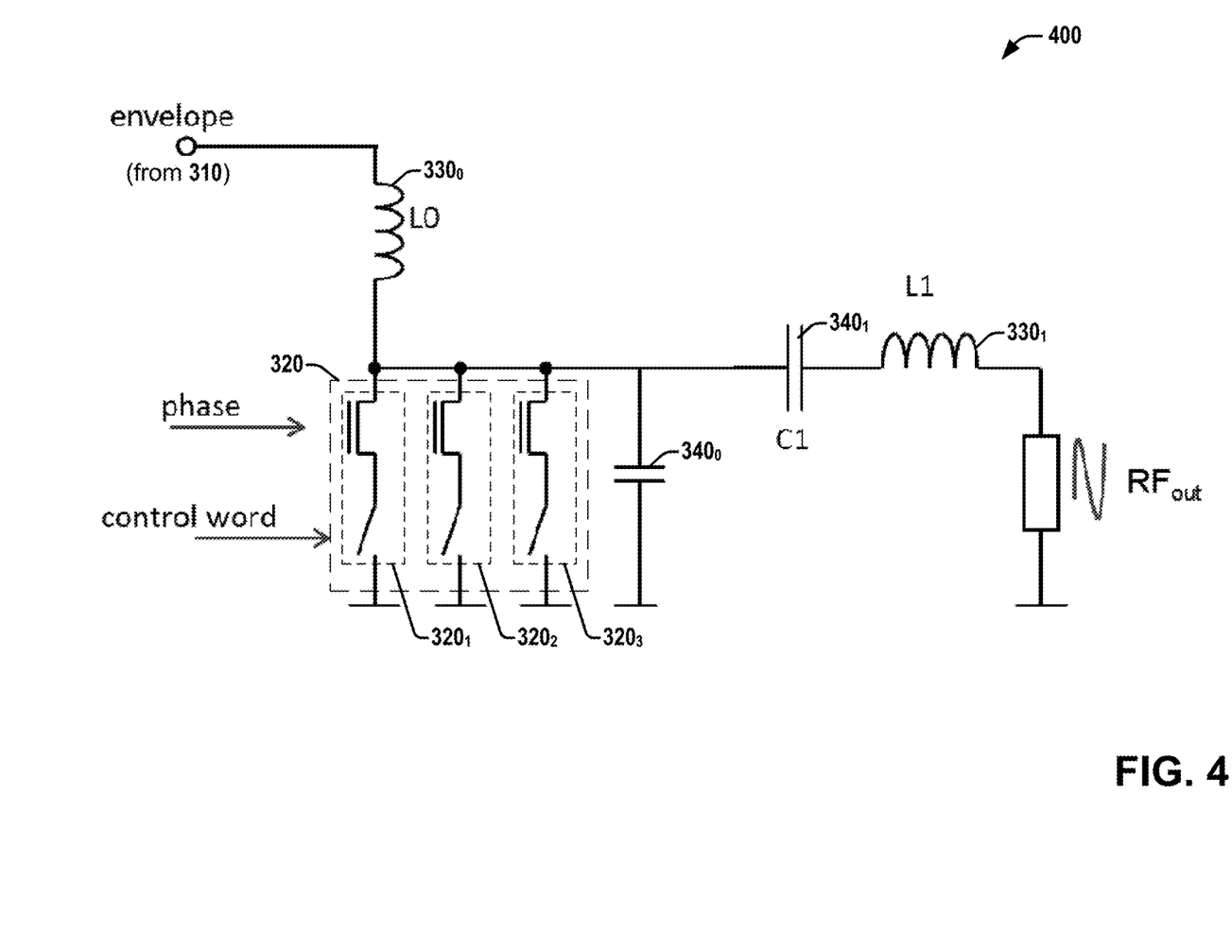
FIG. 4 is a diagram illustrating an example switched mode RFDAC built as a class E DAC with an array of switches such that the number of employed switches depends on the amplitude, in connection with various aspects discussed herein.

In order to reduce the LO (local oscillator) leakage at small power, the switch 320 can also be divided into an array of switches 320$_1$-320$_N$, where the amount of operating switches is dependent on the amplitude. Referring to FIG. 4, illustrated is a diagram of an example switched mode RFDAC 400 built as a class E DAC with an array of switches 320$_i$ such that the number of employed switches depends on the amplitude, in connection with various aspects discussed herein.

However, while such designs potentially provide increased efficiency in ideal situations, existing systems have not employed such designs, because of the Amplitude DAC. Generating an output voltage from a constant input voltage leads to poor efficiency at lower output power. As an example, if a voltage of 1/10 of the supply voltage is to be generated, at least 90% of the power is dissipated in the Amplitude DAC itself.

Figure 5:
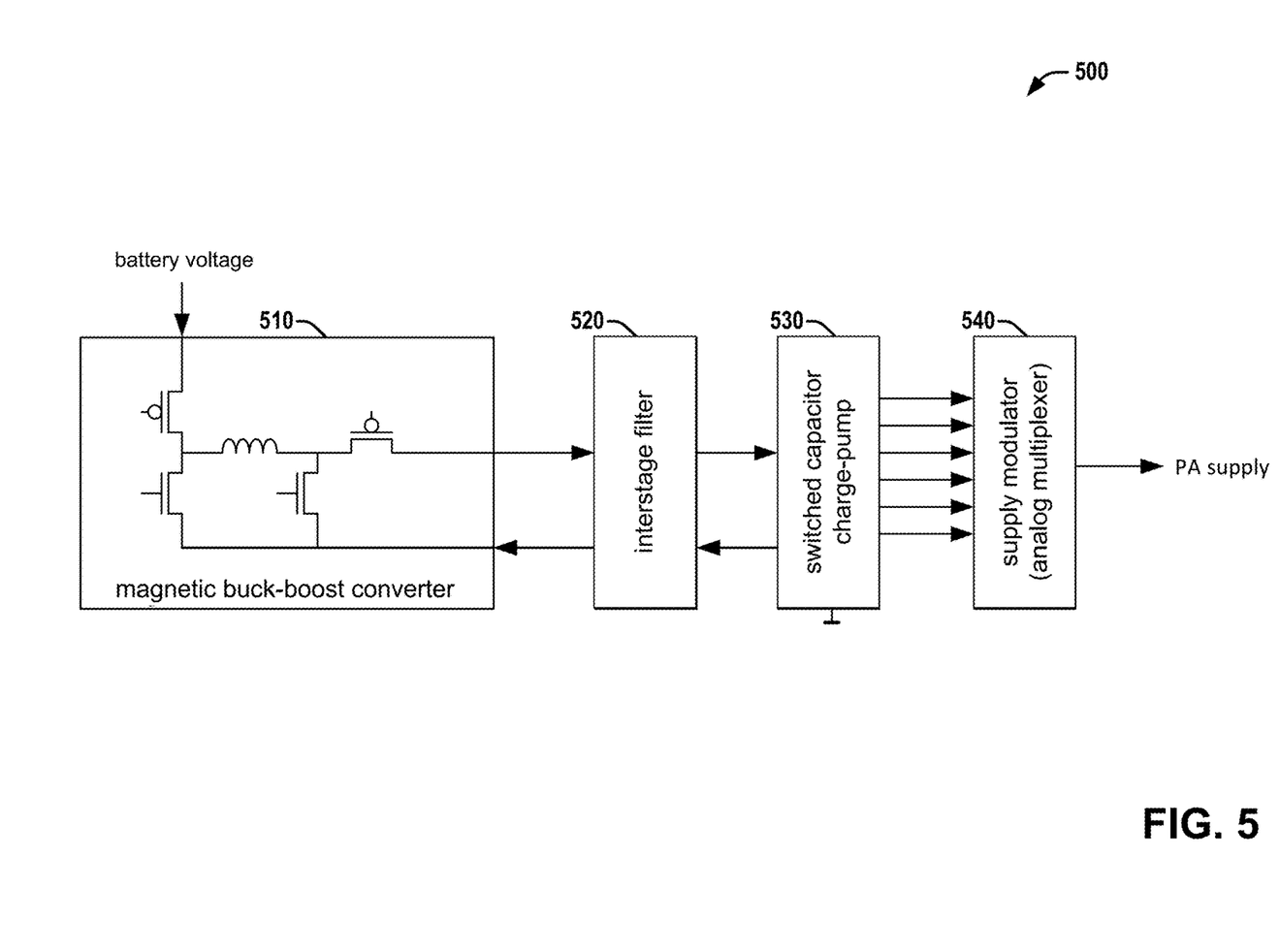
FIG. 5 is a diagram illustrating a system for providing a switched supply to a PA (Power Amplifier), in connection with various aspects discussed herein.

However, in various embodiments discussed herein, the amplitude DAC can be designed such that it can employ a technique similar to a switched supply used for a power amplifier. Referring to FIG. 5, illustrated is a diagram of a system 500 for providing a switched supply to a PA (Power Amplifier), in connection with various aspects discussed herein. For PA envelope tracking, a switched PA supply can be employed such as that of system 500. System 500 comprises a buck-boost converter 510 that can receive a battery voltage and generate a regulated voltage, an interstage filter 520, a switched-capacitor charge pump 530 that can split the regulated voltage into a plurality of distinct voltage levels, and a supply modulator (e.g., analog multiplexer) that can generate the actual PA supply voltage based on the value selected (e.g., to track the instantaneous envelope of the RF signal, etc.).

Figure 6:
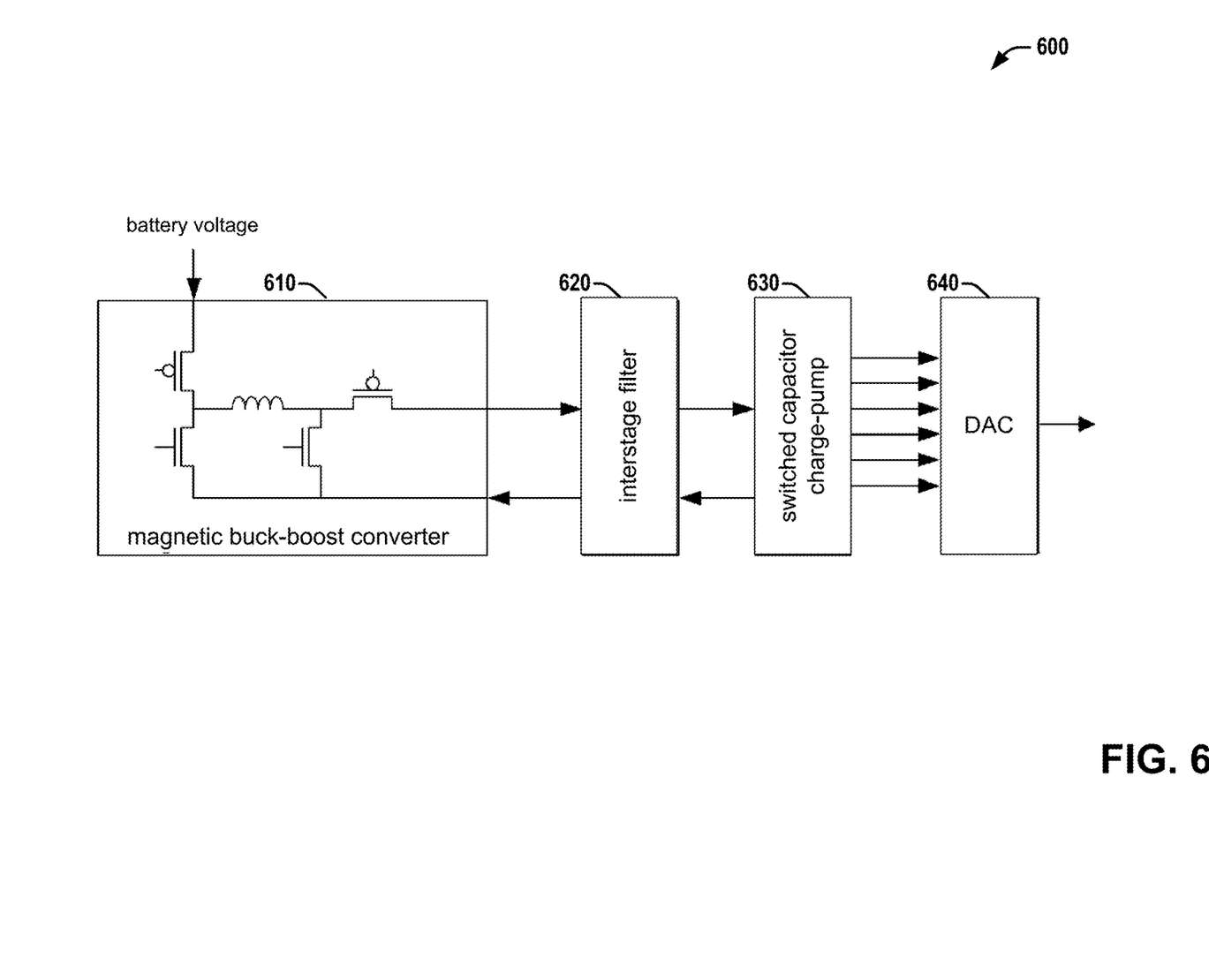
FIG. 6 is a diagram illustrating a system for providing a switched supply to an amplitude DAC, in connection with various aspects discussed herein.

In various embodiments, instead of supplying a PA, a similar structure can be employed for an amplitude DAC. Referring to FIG. 6, illustrated is a diagram of a system 600 for providing a switched supply to an amplitude DAC, in connection with various aspects discussed herein. System 600 can comprise, for example, a magnetic buck-boost converter 610 (similar to converter 510), an interstage filter 620 (similar to filter 520), switched-capacitor charge pump 630 (similar to switched-capacitor charge pump 530), and DAC 640 (e.g., which can be employed as DAC 310 in system 300, and/or as DAC(s) of RF circuitry 106 of system 100 or as DAC(s) of DACs 222 of system 200).

Figure 7:
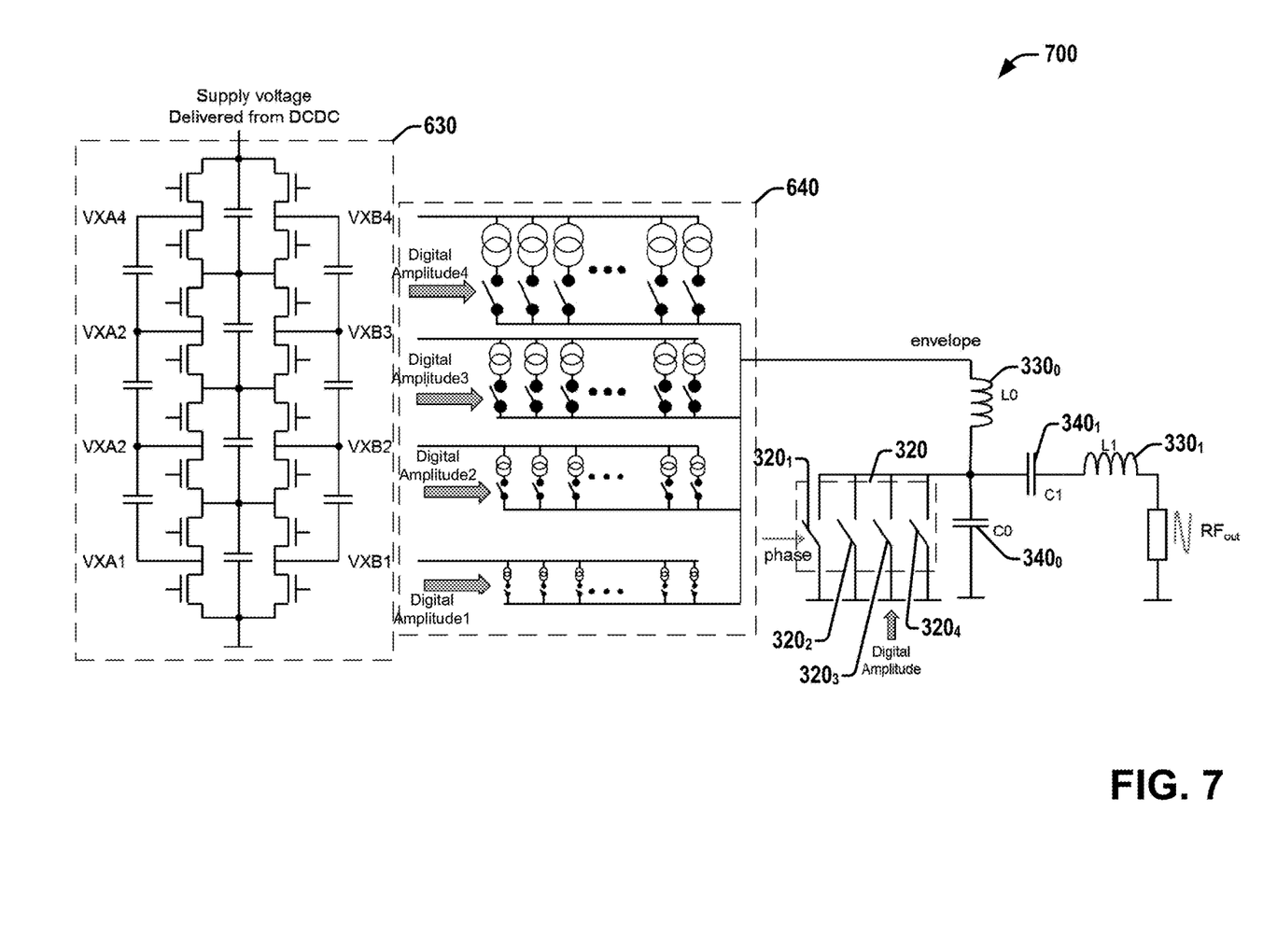
FIG. 7 is a diagram illustrating an example embodiment of a RFDAC according to various aspects discussed herein.

Referring to FIG. 7, illustrated is a diagram of an example embodiment of a RFDAC 700 according to various aspects discussed herein. RFDAC 700 can comprise a switched-capacitor charge pump 630, which can receive a regulated supply voltage delivered from a DC-DC converter (e.g., buck-boost converter 610, for example, via interstage filter 620). RFDAC 700 can also comprise an amplitude DAC 640 (e.g., which can be employed as DAC 310 in system 300, and/or as DAC(s) of RF circuitry 106 of system 100 or as DAC(s) of DACs 222 of system 200). Additionally, RFDAC 700 can comprise additional elements discussed in connection with FIG. 3 (e.g., switch(es) 320, which can comprise a plurality of switches $320_1$-$320_N$ to reduce LO leakage at low power; and inductors $330_0$ and $330_1$ and capacitors $340_0$ and $340_1$ for the class E structure discussed in connection with FIG. 3).

In order to generate a small output power, the smallest voltage of the switched-capacitor charge pump 630 can be used. Similarly, for the highest output power, the power can be delivered by the highest output voltage of switched-capacitor charge pump 630. This can improve the efficiency in back off. Each of the stages (e.g., N stages, for N a positive integer) of switched-capacitor charge pump 630 can have a corresponding stage of amplitude DAC 640 (e.g., which can also have N stages, which can be arranged in parallel, each of which can be configured to receive a digital signal at the corresponding voltage from the corresponding stage of the charge pump 630).

As is apparent from the design of switched-capacitor charge pump 630 and amplitude DAC 640, the relation of the gain of the different stages in the DAC should be correct. Because of this, a static calibration can be built in to correct for the gain error.

Although FIG. 7 illustrates a current mode DAC for DAC 640 as an example embodiment, the architecture of the amplitude DAC 640 is not limited to a current mode DAC. In various embodiments, a switched capacitor DAC or a resistive DAC can be employed as DAC 640 in RFDAC 700.

Figure 8:
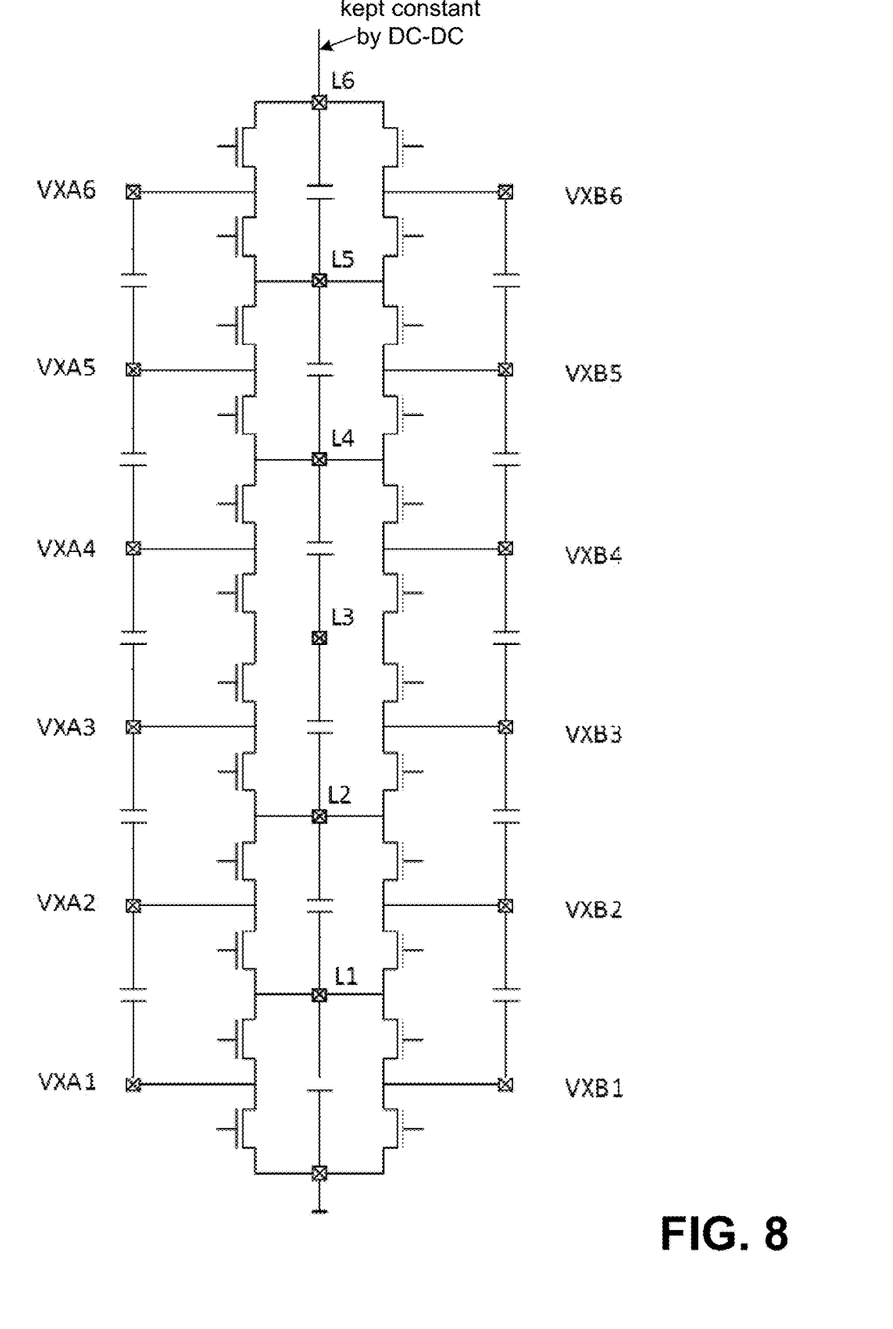
FIG. 8 is a diagram illustrating another example switched-capacitor charge pump that can be employed in connection with various embodiments discussed herein.

A switched-capacitor charge pump such as switched-capacitor charge pump 640 can operate with high efficiency if operated at a natural conversion ratio. Additionally, it has a simple and robust implementation, comprising a single voltage regulation loop, where one voltage is regulated and the others are given by the topology of the switched-capacitor charge pump. The pump architecture generates equally spaced voltages above ground, based on the number of stages or levels of the design of the switched-capacitor charge pump. However, because these levels result from the structure of the switched-capacitor charge pump, they cannot be chosen arbitrarily. Additionally, although FIG. 7 illustrates a specific (four-level) switched-capacitor charge pump as one example embodiment, in various embodiments, other switched-capacitor charge pumps can be employed with different numbers of levels. Referring to FIG. 8, illustrated is a diagram of another example switched-capacitor charge pump that can be employed in connection with various embodiments discussed herein.

Additionally, although FIGS. 6 and 7 illustrate and discuss a switched-capacitor charge pump 630, it is to be understood that switched-capacitor charge pump 630 is provided as one example of a structure configured to generate a plurality of different output voltages. The generation of these voltages is not limited to a switched-capacitor charge pump (e.g., pump 630), and any other architectures that can generate such voltages can be employed, for example, a DC-DC (Direct Current to Direct Current) converter that can generate different output voltages can be used to provide the voltages to DAC 640. Additionally, although FIG. 7 illustrates an embodiment with four levels in switched-capacitor charge pump 630 and four corresponding stages in DAC 640, and FIG. 8 illustrates a switched-capacitor charge pump with six levels that can be employed with a six-stage DAC according to embodiments discussed herein, in various embodiments, any positive integer number of stages can be employed by the DAC, with the corresponding number of voltage levels generated by any relevant architecture capable of generating those voltage levels (e.g., switched-capacitor charge pump, DC-DC converter, etc.).

Figure 9:
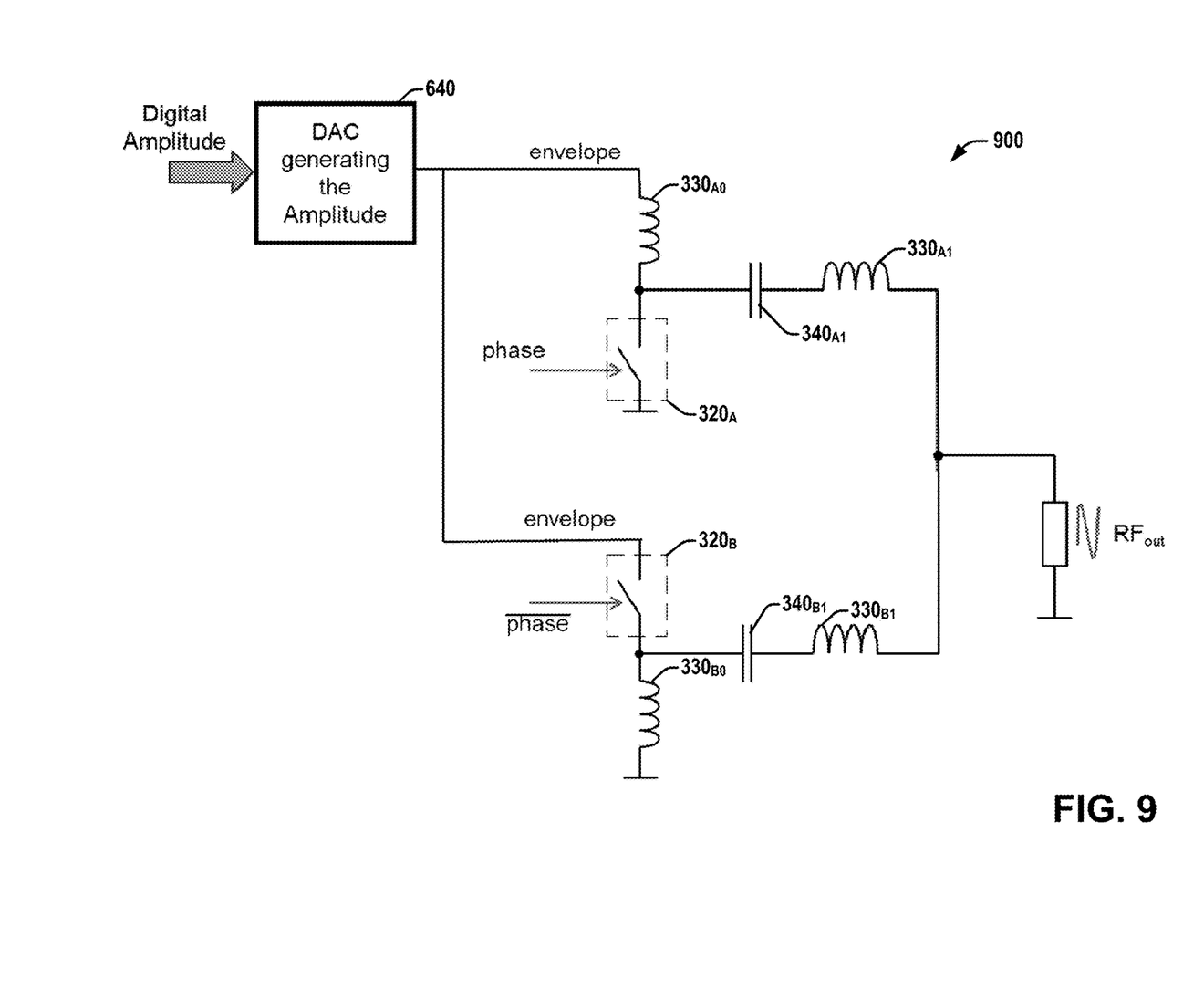
FIG. 9 is a diagram illustrating a first example differential implementation of a RFDAC according to various embodiments discussed herein.
Figure 10:
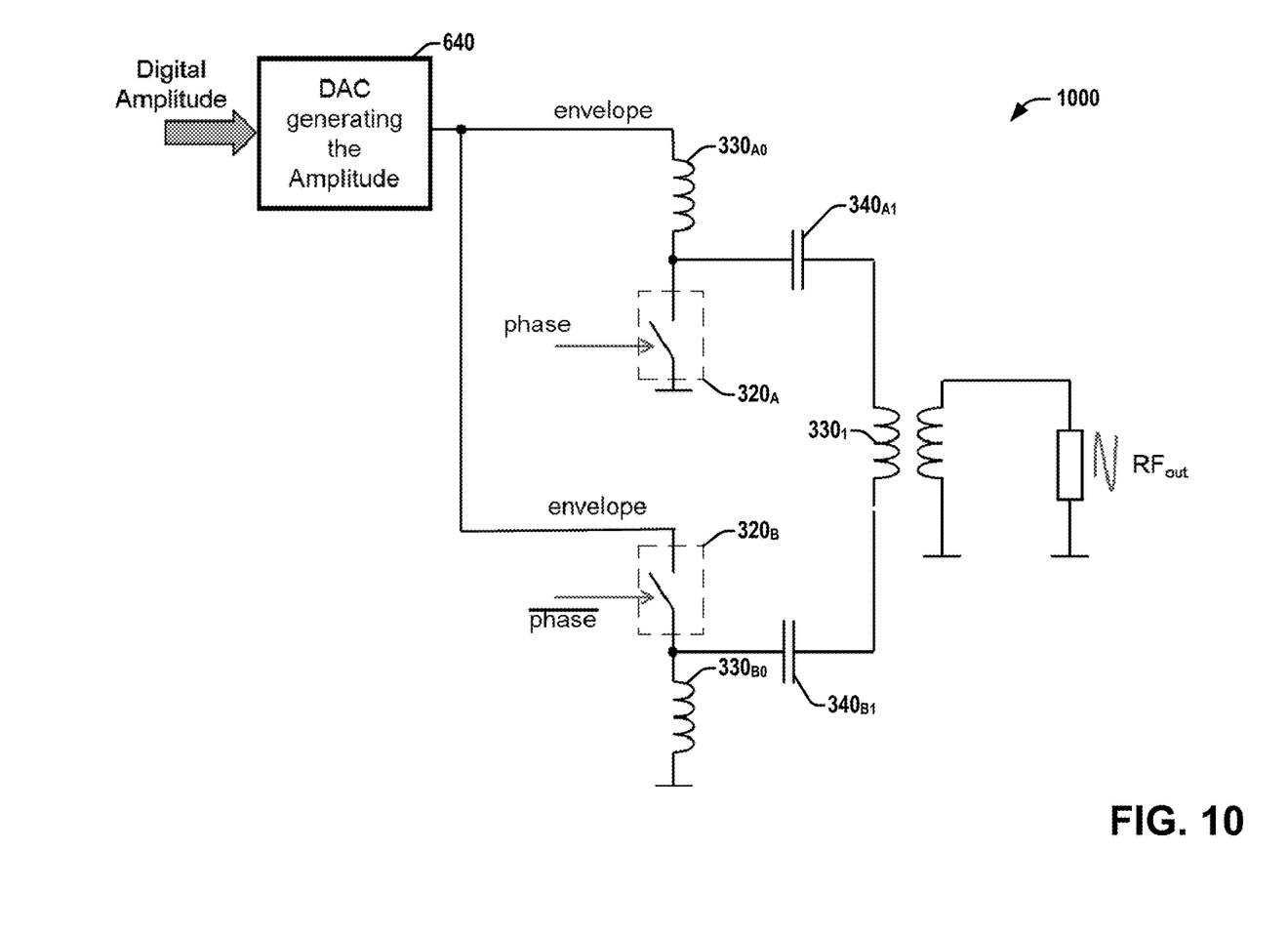
FIG. 10 is a diagram illustrating a second example differential implementation of a RFDAC according to various embodiments discussed herein.

Although, for the purposes of illustrating principles discussed herein, RFDAC 700 was shown as single ended in FIG. 7, one or more differential embodiments can be employed in various implementations, which can provide improved performance over single ended embodiments. In various embodiments, any of a number of different configurations can be employed, for example, different arrangements of circuit elements for RFDACs that are class E DACs employing a DAC according to aspects discussed herein. Referring to FIG. 9, illustrated is a diagram of a first example differential implementation of a RFDAC 900 according to various embodiments discussed herein. Referring to FIG. 10, illustrated is a diagram of a second example differential implementation of a RFDAC 1000 according to various embodiments discussed herein. As can be seen in FIGS. 9 and 10, various embodiments can be employed for implementation, including those of FIG. 9 (with the RFDAC electrically connected to the antenna port) and FIG. 10 (with the RFDAC inductively coupled to the antenna port). The DACs of FIGS. 9 and 10 can generate a differential output, via branches A and B, which can correspond to positive and negative outputs, respectively, or vice versa. Additionally, although for ease of illustration, switches $320_A$ and $320_B$ are shown as individual switches, in various embodiments, switches $320_A$ and $320_B$ can be arrays of switches.

Figure 11:
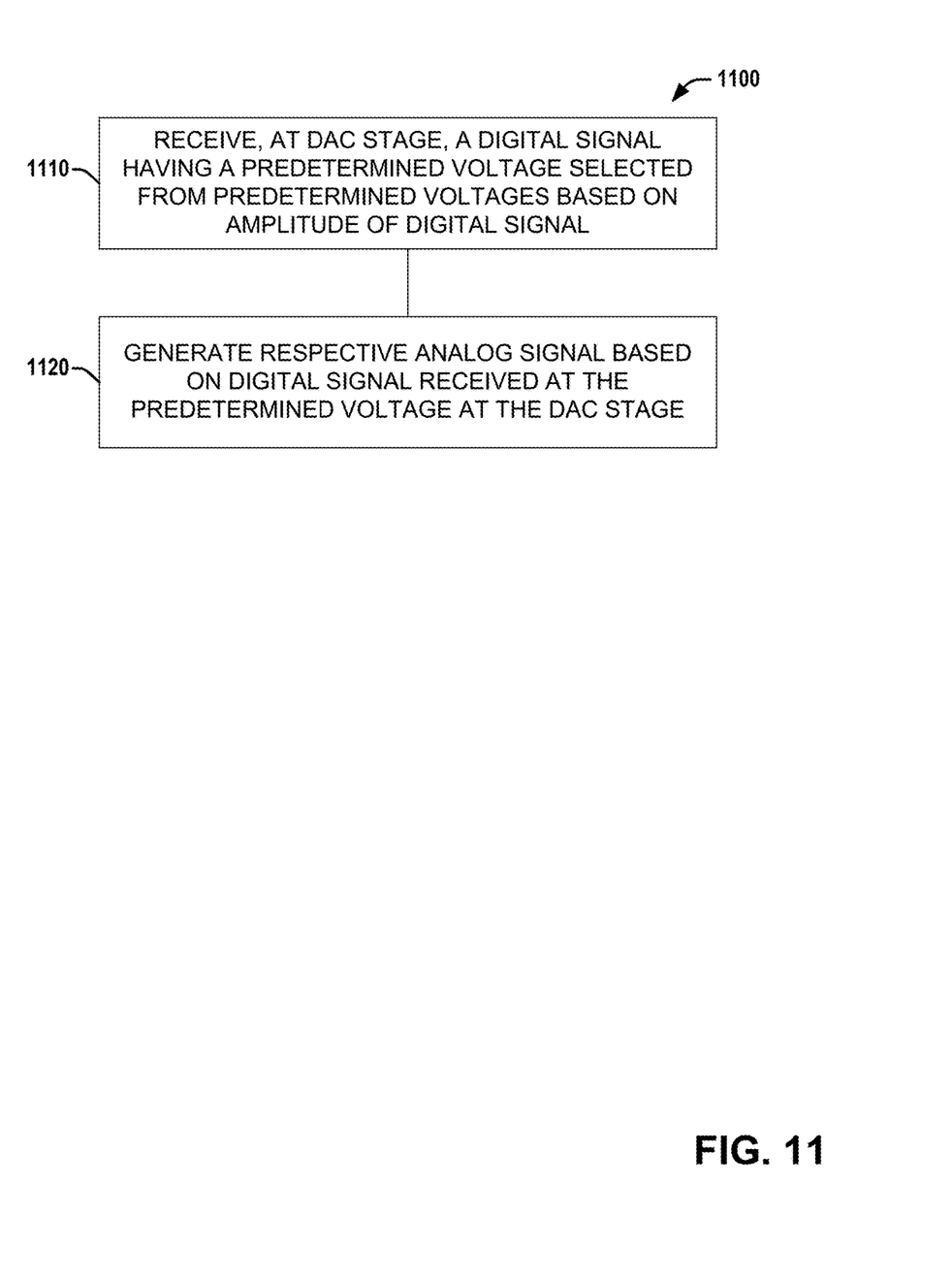
FIG. 11 illustrates a flow diagram of an example method of employing an amplitude DAC or RFDAC according to various aspects described herein.

Referring to FIG. 11, illustrated is a flow diagram of an example method 1100 of employing an amplitude DAC or RFDAC according to various aspects described herein. In some aspects, method 1100 can be performed at an amplitude DAC of embodiments discussed herein, a RFDAC comprising such an amplitude DAC, or a transmitter (e.g., of a mobile device such as a UE or an access point such as an eNB or a gNB, etc.) comprising such a RFDAC. In other aspects, a machine readable medium can store instructions associated with method 1100 that, when executed, can cause a transmitter to perform the acts of method 1100.

At 1110, a digital signal can be received at a predetermined voltage of a plurality of predetermined voltages (e.g., from a switched-capacitor charge pump, DC-DC converter, etc.) via a respective DAC stage of a plurality of DAC stages, wherein the predetermined voltage can be selected based on an amplitude of the digital signal.

At 1120, a respective analog signal can be generated by the respective DAC stage based on the digital signal received at the predetermined voltage.

Additionally or alternatively, method 1100 can include one or more other acts described herein in connection with various aspects discussed herein.

Embodiments discussed herein can provide for improved efficiency compared to existing RFDACs. Via selection of the voltage of the digital amplitude (e.g., via corresponding level(s) of the switched-capacitor charge pump, DC-DC converter, etc.) to the DAC and of the corresponding stage(s) of the DAC (e.g., which can have a plurality of stages, N, corresponding to N possible digital amplitudes of the charge pump, DC-DC, etc.), the DAC can generate the corresponding analog amplitude at or near peak efficiency. As discussed above, for embodiments employing array(s) of switches operated with a modulated frequency for phase information, the number of operating switches can depend on the amplitude, and can thus be controlled via the digital amplitude (or both can be controlled together), which can reduce LO leakage at low power. The DAC can be any of a variety of designs, for example, a current source DAC, switched capacitor DAC, resistive DAC, etc. Based on a given digital amplitude, a predetermined voltage of a plurality of predetermined voltages can be selected for that amplitude (e.g., a smallest predetermined voltage equaling or exceeding the amplitude among the predetermined voltages), and the digital amplitude can be received at the DAC at the selected predetermined voltage (e.g., as output from a DC-DC converter, switched-capacitor charge pump, etc.). The DAC can can generate a respective analog signal via a DAC stage that is associated with the selected predetermined voltage.

Embodiments discussed herein can be employed in connection with any communication standard (e.g., 3GPP (Third Generation Partnership Project) standards such as LTE-A (Long Term Evolution-Advanced), 5G (Fifth Generation)/NR (New Radio), etc.; various 802.11 WiFi standards, etc.), and various embodiments can operate in a wide range of bandwidths. In FIG. 3, the selection of L1 ($330_1$) and C1 ($340_1$) (and corresponding values of respective inductors and capacitors in other embodiments) provides a limit on the bandwidth. In various embodiments, a bandwidth of 20% of the LO frequency is possible, which in some example embodiments can provide a 160 MHz bandwidth with significant power savings due to the improved efficiency of embodiments discussed herein.

Examples herein can include subject matter such as a method, means for performing acts or blocks of the method, at least one machine-readable medium including executable instructions that, when performed by a machine (e.g., a processor with memory, an application-specific integrated circuit (ASIC), a field programmable gate array (FPGA), or the like) cause the machine to perform acts of the method or of an apparatus or system for concurrent communication using multiple communication technologies according to embodiments and examples described.

Example 1 is a Digital-to-Analog Converter (DAC), comprising: a plurality of DAC stages, wherein each DAC stage of the plurality of DAC stages is associated with a respective predetermined voltage of a plurality of predetermined voltages, wherein each DAC stage of the plurality of DAC stages is configured to receive a digital signal at the respective predetermined voltage associated with that DAC stage when the respective predetermined voltage of that DAC stage is a selected predetermined voltage of the plurality of predetermined voltages, wherein the selected predetermined voltage is based on an amplitude of the digital signal, and wherein each DAC stage of the plurality of DAC stages is further configured to generate a respective analog signal associated with that DAC stage based on the digital signal received at that DAC stage when the respective predetermined voltage of that DAC stage is the selected predetermined voltage.

Example 2 comprises the subject matter of any variation of any of example(s) 1, wherein the DAC is a current source DAC.

Example 3 comprises the subject matter of any variation of any of example(s) 1-2, wherein the DAC is a switched-capacitor DAC.

Example 4 comprises the subject matter of any variation of any of example(s) 1-3, wherein the DAC is a resistive DAC.

Example 5 comprises the subject matter of any variation of any of example(s) 1-4, wherein the DAC is configured to generate a differential output based on the respective analog signals associated with the plurality of DAC stages.

Example 6 comprises the subject matter of any variation of any of example(s) 1-5, wherein, for each DAC stage of the plurality of DAC stages, the respective predetermined voltage associated with that DAC stage is the selected predetermined voltage when the respective predetermined voltage of that DAC stage is a smallest predetermined voltage of the plurality of predetermined voltages that is greater than or equal to the amplitude of the digital signal.

Example 7 is a RFDAC (RF (Radio Frequency) DAC (Digital-to-Analog Converter)), comprising: an amplitude DAC, comprising: a plurality of DAC stages, wherein each DAC stage of the plurality of DAC stages is associated with a respective predetermined voltage of a plurality of predetermined voltages, wherein each DAC stage of the plurality of DAC stages is configured to receive a digital signal at the respective predetermined voltage associated with that DAC stage when the respective predetermined voltage is a selected predetermined voltage of the plurality of predetermined voltages, wherein the selected predetermined voltage is based on an amplitude of the digital signal, and wherein each DAC stage of the plurality of DAC stages is further configured to generate a respective analog signal associated with that DAC stage based on the digital signal received at that DAC stage when the respective predetermined voltage of that DAC stage is the selected predetermined voltage; and one or more switches configured to operate with a frequency modulated by a phase of the RF signal.

Example 8 comprises the subject matter of any variation of any of example(s) 7, wherein the one or more switches comprises one or more arrays of switches, wherein each array of switches comprises an associated plurality of switches, wherein, for each array of switches, a number of operating switches of the associated plurality of switches of that array is based on the present amplitude of the RF signal.

Example 9 comprises the subject matter of any variation of any of example(s) 7-8, wherein the RFDAC is a class E DAC.

Example 10 comprises the subject matter of any variation of any of example(s) 7-9, wherein the amplitude DAC is a current source DAC.

Example 11 comprises the subject matter of any variation of any of example(s) 7-10, wherein the amplitude DAC is a switched-capacitor DAC.

Example 12 comprises the subject matter of any variation of any of example(s) 7-11, wherein the amplitude DAC is a resistive DAC.

Example 13 comprises the subject matter of any variation of any of example(s) 7-12, wherein the amplitude DAC is configured to generate a differential output based on the respective analog signals associated with the plurality of DAC stages.

Example 14 comprises the subject matter of any variation of any of example(s) 7-13, wherein, for each DAC stage of the plurality of DAC stages, the respective predetermined voltage associated with that DAC stage is the selected predetermined voltage when the respective predetermined voltage of that DAC stage is a smallest predetermined voltage of the plurality of predetermined voltages that is greater than or equal to the amplitude of the digital signal.

Example 15 is an apparatus configured to be employed in a communication device, comprising: means for generating a digital signal at a selected predetermined voltage of a plurality of predetermined digital voltages, wherein the selected predetermined voltage is based on an amplitude of the digital signal; an amplitude DAC, comprising: a plurality of DAC stages, wherein each DAC stage of the plurality of DAC stages is associated with a respective predetermined voltage of the plurality of predetermined voltages, wherein each DAC stage of the plurality of DAC stages is configured to receive a digital signal at the respective predetermined voltage associated with that DAC stage when the respective predetermined voltage is the selected predetermined voltage of the plurality of predetermined voltages, and wherein each DAC stage of the plurality of DAC stages is further configured to generate a respective analog signal associated with that DAC stage based on the digital signal received at that DAC stage when the respective predetermined voltage of that DAC stage is the selected predetermined voltage; and one or more switches configured to operate with a frequency modulated by a phase of the RF signal.

Example 16 comprises the subject matter of any variation of any of example(s) 15, wherein the means for generating the digital signal at the selected predetermined voltage comprises a switched-capacitor charge pump.

Example 17 comprises the subject matter of any variation of any of example(s) 15-16, wherein the means for generating the digital signal at the selected predetermined voltage comprises a Direct Current (DC) to DC converter.

Example 18 comprises the subject matter of any variation of any of example(s) 15-17, wherein the one or more switches comprises one or more arrays of switches, wherein each array of switches comprises an associated plurality of switches, wherein, for each array of switches, a number of operating switches of the associated plurality of switches of that array is based on the present amplitude of the RF signal.

Example 19 comprises the subject matter of any variation of any of example(s) 15-18, wherein the amplitude DAC is a current source DAC.

Example 20 comprises the subject matter of any variation of any of example(s) 15-19, wherein the amplitude DAC is a switched-capacitor DAC.

Example 21 comprises the subject matter of any variation of any of example(s) 15-20, wherein the amplitude DAC is a resistive DAC.

Example 22 comprises the subject matter of any variation of any of example(s) 15-21, wherein the amplitude DAC is configured to generate a differential output based on the respective analog signals associated with the plurality of DAC stages.

Example 23 comprises the subject matter of any variation of any of example(s) 15-22, wherein, for each DAC stage of the plurality of DAC stages, the respective predetermined voltage associated with that DAC stage is the selected predetermined voltage when the respective predetermined voltage of that DAC stage is a smallest predetermined voltage of the plurality of predetermined voltages that is greater than or equal to the amplitude of the digital signal.

Example 24 comprises an apparatus comprising means for executing any of the described operations of examples 1-23.

Example 25 comprises a method of performing any of the described operations of examples 1-23.

Example 26 comprises a machine readable medium that stores instructions for execution by a processor to perform any of the described operations of examples 1-23.

Example 27 comprises an apparatus comprising circuitry configured to perform any of the described operations of examples 1-23.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations. In addition, while a particular feature may have been disclosed with respect to only one of several implementations, such feature may be combined with one or more other features of the other implementations as may be desired and advantageous for any given or particular application.

What is claimed is:

1. A Digital-to-Analog Converter (DAC), comprising:
   a plurality of DAC stages, wherein each DAC stage of the plurality of DAC stages is associated with a respective predetermined voltage of a plurality of predetermined voltages, comprising:
   a first DAC stage, wherein the first DAC stage is associated with a first predetermined voltage of the plurality of predetermined voltages, wherein the first DAC stage is configured to receive a digital signal at the first predetermined voltage when the first predetermined voltage is a selected predetermined voltage of the plurality of predetermined voltages, wherein the selected predetermined voltage is based on an amplitude of the digital signal, and wherein the first DAC stage is further configured to generate a first analog signal based on the digital signal received at the first DAC stage when the first predetermined voltage is the selected predetermined voltage; and
   a second DAC stage, wherein the second DAC stage is associated with a second predetermined voltage of the plurality of predetermined voltages, wherein the second DAC stage is configured to receive the digital signal at the second predetermined voltage when the second predetermined voltage is the selected predetermined voltage, and wherein the second DAC stage is further configured to generate a second analog signal based on the digital signal received at the second DAC stage when the second predetermined voltage is the selected predetermined voltage.

2. The DAC of claim 1, wherein the DAC is a current source DAC.

3. The DAC of claim 1, wherein the DAC is a switched-capacitor DAC.

4. The DAC of claim 1, wherein the DAC is a resistive DAC.

5. The DAC of claim 1, wherein the DAC is configured to generate a differential output based on at least one of the first analog signal, the second analog signal, or one or more additional analog signals of the plurality of DAC stages.

6. The DAC of claim 1, wherein the first predetermined voltage is the selected predetermined voltage when the first predetermined voltage is a smallest predetermined voltage of the plurality of predetermined voltages that is greater than or equal to the amplitude of the digital signal, and wherein the second predetermined voltage is the selected predetermined voltage when the second predetermined voltage is the smallest predetermined voltage of the plurality of predetermined voltages that is greater than or equal to the amplitude of the digital signal.

7. A RFDAC (RF (Radio Frequency) DAC (Digital-to-Analog Converter)), comprising:
an amplitude DAC, comprising:
a plurality of DAC stages, wherein each DAC stage of the plurality of DAC stages is associated with a respective predetermined voltage of a plurality of predetermined voltages,
wherein each DAC stage of the plurality of DAC stages is configured to receive a digital signal at the respective predetermined voltage associated with that DAC stage when the respective predetermined voltage is a selected predetermined voltage of the plurality of predetermined voltages, wherein the selected predetermined voltage is based on an amplitude of the digital signal, and
wherein each DAC stage of the plurality of DAC stages is further configured to generate a respective analog signal associated with that DAC stage based on the digital signal received at that DAC stage when the respective predetermined voltage of that DAC stage is the selected predetermined voltage; and
one or more switches configured to operate with a frequency modulated by a phase of the RF signal.

8. The RFDAC of claim 7, wherein the one or more switches comprises one or more arrays of switches, wherein each array of switches comprises an associated plurality of switches, wherein, for each array of switches, a number of operating switches of the associated plurality of switches of that array is based on the present amplitude of the RF signal.

9. The RFDAC of claim 7, wherein the RFDAC is a class E DAC.

10. The RFDAC of claim 7, wherein the amplitude DAC is a current source DAC.

11. The RFDAC of claim 7, wherein the amplitude DAC is a switched-capacitor DAC.

12. The RFDAC of claim 7, wherein the amplitude DAC is a resistive DAC.

13. The RFDAC of claim 7, wherein the amplitude DAC is configured to generate a differential output based on the respective analog signals associated with the plurality of DAC stages.

14. The RFDAC of claim 7, wherein, for each DAC stage of the plurality of DAC stages, the respective predetermined voltage associated with that DAC stage is the selected predetermined voltage when the respective predetermined voltage of that DAC stage is a smallest predetermined voltage of the plurality of predetermined voltages that is greater than or equal to the amplitude of the digital signal.

15. An apparatus configured to be employed in a communication device, comprising:
means for generating a digital signal at a selected predetermined voltage of a plurality of predetermined digital voltages, wherein the selected predetermined voltage is based on an amplitude of the digital signal;
an amplitude DAC, comprising:
a plurality of DAC stages, wherein each DAC stage of the plurality of DAC stages is associated with a respective predetermined voltage of the plurality of predetermined voltages,
wherein each DAC stage of the plurality of DAC stages is configured to receive a digital signal at the respective predetermined voltage associated with that DAC stage when the respective predetermined voltage is the selected predetermined voltage of the plurality of predetermined voltages, and
wherein each DAC stage of the plurality of DAC stages is further configured to generate a respective analog signal associated with that DAC stage based on the digital signal received at that DAC stage when the respective predetermined voltage of that DAC stage is the selected predetermined voltage; and
one or more switches configured to operate with a frequency modulated by a phase of the RF signal.

16. The apparatus of claim 15, wherein the means for generating the digital signal at the selected predetermined voltage comprises a switched-capacitor charge pump.

17. The apparatus of claim 15, wherein the means for generating the digital signal at the selected predetermined voltage comprises a Direct Current (DC) to DC converter.

18. The apparatus of claim 15, wherein the one or more switches comprises one or more arrays of switches, wherein each array of switches comprises an associated plurality of switches, wherein, for each array of switches, a number of operating switches of the associated plurality of switches of that array is based on the present amplitude of the RF signal.

19. The apparatus of claim 15, wherein the amplitude DAC is a current source DAC.

20. The apparatus of claim 15, wherein the amplitude DAC is a switched-capacitor DAC.

21. The apparatus of claim 15, wherein the amplitude DAC is a resistive DAC.

22. The apparatus of claim 15, wherein the amplitude DAC is configured to generate a differential output based on the respective analog signals associated with the plurality of DAC stages.

23. The apparatus of claim 15, wherein, for each DAC stage of the plurality of DAC stages, the respective predetermined voltage associated with that DAC stage is the selected predetermined voltage when the respective predetermined voltage of that DAC stage is a smallest predetermined voltage of the plurality of predetermined voltages that is greater than or equal to the amplitude of the digital signal.

* * * * *